United States Patent
Confalonieri et al.

(10) Patent No.: US 7,317,637 B2
(45) Date of Patent: Jan. 8, 2008

(54) PROGRAMMING METHOD OF MULTILEVEL MEMORIES AND CORRESPONDING CIRCUIT

(75) Inventors: Emanuele Confalonieri, Milan (IT); Nicola Del Gatto, Torre Del Greco (IT); Carlo Lisi, Milan (IT); Marco Ferrario, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 127 days.

(21) Appl. No.: 11/261,903

(22) Filed: Oct. 27, 2005

(65) Prior Publication Data

US 2006/0120161 A1 Jun. 8, 2006

(30) Foreign Application Priority Data

Oct. 29, 2004 (IT) .......................... MI2004A2071

(51) Int. Cl.
*G11C 11/34* (2006.01)
(52) U.S. Cl. .......................... 365/185.22; 365/189.11; 365/230.06
(58) Field of Classification Search ........... 365/185.22, 365/189.11, 230.06, 189.01
See application file for complete search history.

(56) References Cited

U.S. PATENT DOCUMENTS

| | | | |
|---|---|---|---|
| 5,661,685 A * | 8/1997 | Lee et al. ............... | 365/185.22 |
| 2001/0040825 A1 | 11/2001 | Sugimura .............. | 365/185.22 |
| 2002/0024846 A1* | 2/2002 | Kawahara et al. ..... | 365/185.24 |
| 2003/0151945 A1* | 8/2003 | Tanzawa ................ | 365/185.01 |
| 2003/0206469 A1 | 11/2003 | Wong ..................... | 365/200 |

* cited by examiner

*Primary Examiner*—Son Dinh
(74) *Attorney, Agent, or Firm*—Lisa K. Jorgenson; E. Russell Tarleton; Seed IP Law Group PLLC

(57) ABSTRACT

A method and circuit for programming a multilevel memory of a flash EEPROM type having a matrix of cells grouped in memory words. The method provides for the simultaneous generation of a first programming voltage value and a second verify voltage value to bias word lines of the memory matrix during programming and verify operations, respectively, of the memory itself. A circuit implementing the above method is also provided.

18 Claims, 4 Drawing Sheets

US 7,317,637 B2

PROGRAMMING METHOD OF MULTILEVEL MEMORIES AND CORRESPONDING CIRCUIT

BACKGROUND OF THE INVENTION

1. Field of the Invention

The present invention relates to a method for programming multilevel memories and to a corresponding circuit and, more specifically, to a method for programming multilevel memories of the flash EEPROM type wherein the memory comprises a matrix of cells organized in rows and columns and grouped in memory words and to a circuit of the above type for NROM flash memories with two-bit cells.

2. Description of the Related Art

As is well known in semiconductor-integrated memory electronic devices the need for greater "density" has led to the development of so-called multilevel memories, i.e., memories wherein each single flash cell stores a number of bits greater than one.

A fundamental operation in multilevel memories is programming. In fact, in the case of multilevel memories, with respect to the programming of single-level memories, it is necessary to control, in a very accurate way, the threshold voltage values of the multilevel cells.

A first known solution to meet this need is represented by a multilevel programming method that uses a sequence of programming and verification pulses.

Making reference, by way of non limiting example, to a memory with two bits per cell, if the distribution of the cells "00" is considered as a single-level distribution, the method can be divided in two steps: a first real multilevel step, used for constructing the distributions "10" and "01" and a subsequent quicker step for constructing the distribution "00". It should be noted that the programming of the cells "00" does not necessarily require continuously verifying the evolution of the threshold of the cells under programming.

In a classical multilevel programming method, a programming step involves a series of box-like voltage pulses applied to the gate terminal of the cells to be programmed, alternated by verify operations. The width of the programmed distribution is a function of the voltage difference between two successive pulses and of the precision with which the cell terminals are regulated. In general, a precise regulation of the voltage implies a slowness of the regulation itself. The verify and programming operations require two different voltage levels applied to the gate terminal.

FIG. 1 shows the drain (Vdrain) and gate (Vgate) voltages of a memory cell during a multilevel programming. The gate voltage (Vgate) switches between different values, for controlling the programming and verify operations of a cell, employing a time $Tpv_i$ for switching from a programming voltage value (Vgi 1=1 ... N) to a verify voltage value (Vv) and a time $Tvp_i$ for performing the contrary switch.

The programming Vgi and verify Vv voltage values are obtained by the same charge pump circuit.

FIG. 2, by way of example, globally and schematically shows a programming circuit 100 of a multilevel memory cell.

In the circuit there are a first supply block 1, including, for example, a charge pump 1a, intended to supply voltage values for programming and verify operations and a second supply block 2 that has a charge pump 2a intended to supply voltage values for read operations of memory cells. The charge pump 1a has a first output line Umod, whereas the second charge pump 2a has an output line Uread.

A voltage Vxs that is regulated by the two charge pumps 1a, 2a is brought, through a switch 4, to the input of a row decoder 3, in turn connected to word lines WLs of the multilevel memory. The switch 4 selects the operation which is to be performed on a corresponding multilevel memory cell, i.e., programming, verifying and reading.

The switch 4 has a voltage elevator or booster 5 that includes an input connected to a logic gate 6 in turn receiving at an input an enable signal SECT_EN and an operative mode signal MOD. The signal SECT_EN enables a sector whereon an operation has to be performed, whereas the operative mode signal MOD identifies the operation which is to be performed, i.e., programming, verifying or reading.

Although advantageous under several aspects, this multilevel programming method shows various drawbacks.

In particular, the management, by a single supply block 1 and, in particular by the single charge pump 1a, of the switches of the voltage Vxs on the word line WLs, from a programming voltage level to the verify one and vice versa requires considerable time.

The circuit 100, by means of the charge pump 1a, increases the voltage Vxs for a successive programming pulse of a cell only after the end of a verify operation; in consequence, before emitting a new pulse a long time $Tvp_i$ will transpire. Moreover, the time required also increases when the absolute value of the difference between the verify voltage and the voltage of the pulse produced by the charge pump 1a voltage increases, as shown in FIG. 1 wherein $Tvp_i > Tvp_{i+1}$ and $Tvp_i > Tvp_{i+1}$. In consequence, the management of the switches tends to become slower and slower.

The technical problem underlying the present invention is that of providing a multilevel programming method having such functional characteristics that reduces the programming times of multilevel cells, overcoming the limits and the drawbacks affecting the known methods.

BRIEF SUMMARY OF THE INVENTION

The disclosed embodiments of the present invention provide a simultaneous generation of programming and verify voltage values for biasing the word lines of a multilevel memory device.

In accordance with one embodiment of the invention, a method for programming a multilevel memory of the flash EEPROM type having a matrix of cells grouped in memory words and associated with a row decoder circuit supplied by a first supply block and by a second supply block associated with corresponding charge pumps is provided. In accordance with the method, a first programming voltage value and a second verify voltage value are simultaneously generated for biasing word lines of the memory matrix during respective programming and verify operations of the memory.

In accordance with another aspect of the foregoing embodiment, a programming voltage value and the verify voltage value are applied simultaneously on either two output lines of a second charge pump or on an output line of a third charge pump and an output line of a fourth charge pump, respectively, that are formed as part of the second supply block.

In accordance with another embodiment of the invention, a programming circuit of multilevel memories is provided that includes a first supply block to generate voltage values for read operations of memory cells; a second supply block to generate voltage values for programming and verify operations of memory cells; a row decoder to select the word lines of memory cells to be selected; a switch to select the programming or verify operation to be performed on memory cells; and the second supply block having a first output line and a second output line, the first output line biasing word lines for programming operations and the second output line biasing word lines for verify operations.

In accordance with another embodiment of the invention, a programming circuit of multilevel memories is provided that includes a first supply block to generate voltage values for read operations of memory cells; a second supply block to generate voltage values for programming and verify operations of the memory cells; a row decoder to select word lines of memory cells to be programmed; a selection circuit to select the programming or verify operation to be performed on the memory cells; and the second supply block comprising a third charge pump and a fourth charge pump, the third charge pump having an output line to bias word lines for programming operations, the fourth charge pump having an output line to bias word lines for verify operations.

In accordance with another embodiment of the invention, a method is provided that includes generating a first programming voltage and a verifying voltage; enabling a first switch to supply the first programming voltage to a word line coupled to a matrix of memory cells; and enabling a second switch to supply the verifying voltage to the word line. Ideally the step of generating includes simultaneously generating the programming voltage and the verifying voltage via a program voltage generator and a verifying voltage generator, respectively.

In accordance with another aspect of the foregoing embodiment, the verifying voltage remains at a constant value, and when the verifying voltage is supplied to the word line, the programming voltage can be generated at a different voltage level for a subsequent programming voltage application.

In accordance with another aspect of the foregoing embodiment, the method includes disabling the first switch to not supply the first programming voltage at the time of or before the enabling of the second switch; and disabling the second switch at the time of or prior to a further step of enabling the first switch again.

In accordance with another aspect of the foregoing embodiment, the first programming voltage and the verifying voltage are supplied to the word line via a row decoder.

In accordance with another embodiment of the invention, a circuit is provided that includes a first voltage generator configured to supply a programming voltage; a second voltage generator configured to supply a verifying voltage; and a selector circuit configured to receive the programming voltage and the verifying voltage and to selectively output one of the programming voltage and the verifying voltage to a word line. Ideally, the first and second voltage generators are configured to simultaneously generate the programming voltage and the verifying voltage.

In accordance with another aspect of the foregoing embodiment, the word line couples the first and second voltage generators to a matrix of memory cells via a row decoder. In one embodiment, the memory cells comprise a multilevel memory of flash EEPROM cells organized in rows and columns and grouped in memory words. In another embodiment the memory cells comprise two-bit NRON flash memory cells.

In accordance with another embodiment of the invention, a method is provided that includes simultaneously generating a programming voltage and a verifying voltage, and selectively applying one of the programming voltage and the verifying voltage at a time to a word line.

In accordance with another aspect of the foregoing embodiment, the simultaneous generation of the programming voltage and the verifying voltage includes varying a voltage level of the programming voltage during the time the verifying voltage is applied to the word line.

In accordance with another aspect of the foregoing embodiment, simultaneously generating the programming voltage and the verifying voltage includes simultaneously generating the programming voltage at a first voltage generator and generating the verifying voltage at a second voltage generator and applying these two voltages respectively to a selection circuit.

BRIEF DESCRIPTION OF THE SEVERAL VIEWS OF THE DRAWINGS

The characteristics and advantages of the method and of the circuit according to the disclosed embodiments of the invention will be apparent from the following description thereof given by way of indicative and non-limiting examples with reference to the annexed drawings, wherein.

DETAILED DESCRIPTION OF THE INVENTION

Figure 4:
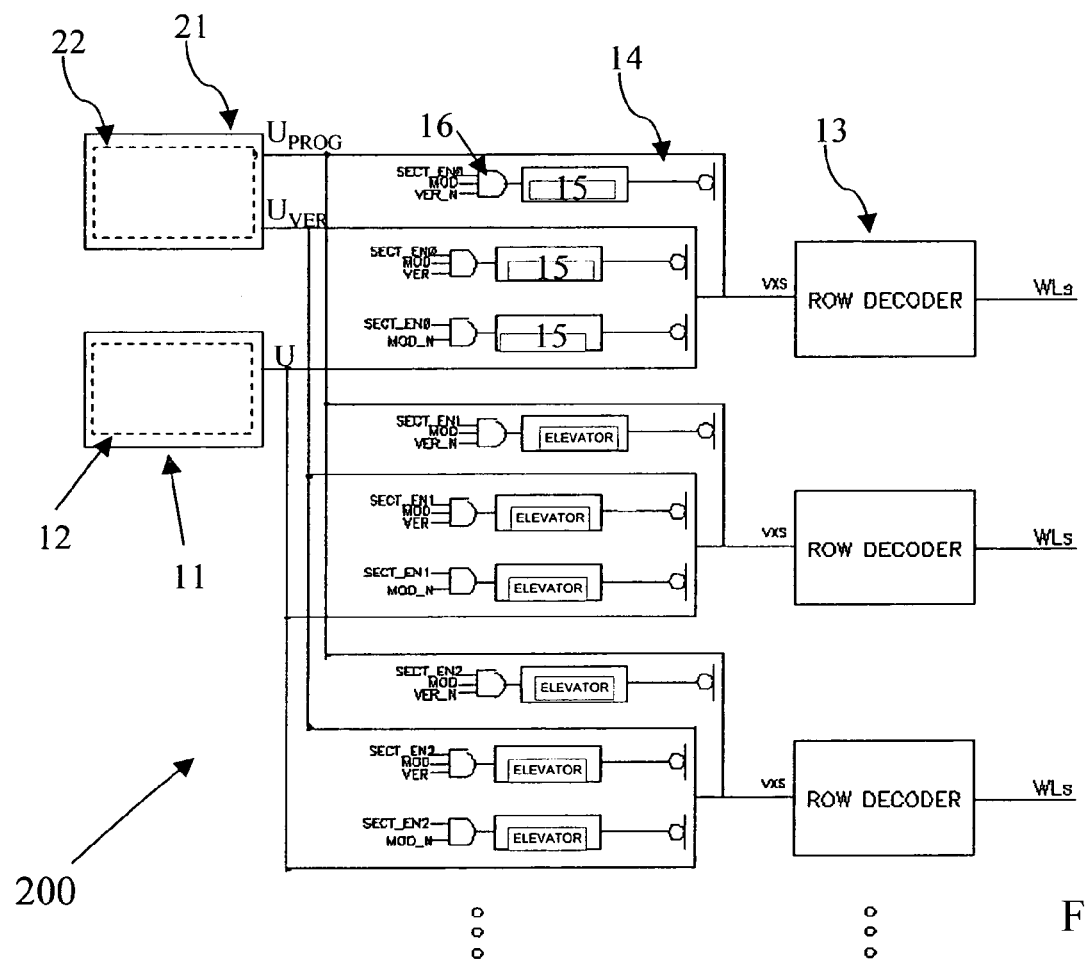
FIG. 4 schematically shows a first preferred embodiment of a multilevel programming circuit according to the present invention.

With reference to FIG. 4, a programming circuit of multilevel memories according to a first preferred embodiment, globally indicated with 200, is shown. The circuit 200 is associated with a matrix of multilevel memory cells, not shown in the drawings since they are conventional. Only a plurality of connections WLS under the rows or word lines of the memory cells of this matrix are schematically indicated, each one being associated with a corresponding decode circuit.

In the circuit 200 there is a first supply block 11 having a first charge pump 12, and a second supply block 21 having a second charge pump 22. The first charge pump 12 is intended to supply voltage values for read operations of memory cells and it has a first output line U. The second charge pump 22 is intended to supply voltage values for programming and verify operations of memory cells.

Advantageously, according to the invention, the second charge pump 22 has a second output line $U_{PROG}$ and a third output line $U_{VER}$, respectively intended to transmit a programming voltage value $V_{PROG}$ and a verify voltage value $V_{VER}$ for the programming or verify steps of memory cells.

Advantageously, according to the invention, $V_{PROG}$ is regulated at various voltage levels and it is used for biasing the word lines WLs during the programming pulses, whereas $V_{VER}$ is set at a fixed value and it is used for biasing the word lines WLs during the verify operations.

The two regulation voltages $V_{PROG}$ and $V_{VER}$ are suitably managed through an inner regulation of the circuit 200 and they are connected to the row decoders 13 through a dedicated switch 14.

A voltage Vxs, having a value equal to $V_{PROG}$ while programming and $V_{VER}$ while verifying and being regulated by the two charge pumps 12 and 22 is supplied, through the switch 14, at the input of a row decoder 13, in turn connected to word lines WLs of the multilevel memory.

The switch 14 selects the operation that is to be performed on a corresponding multilevel memory cell, i.e., programming or verify.

With respect to the prior solution the switch 14, intended for the management of the voltage VXS, manages a new high voltage signal. In fact a verify signal VER, as shown in FIG. 4, is added, according to the present invention, to the control signals of the prior switch 4.

The switch 14 comprises a voltage elevator or booster 15 that has an input connected to a logic gate 16, in turn receiving at inputs an enable signal SECT_EN, an operative mode signal MOD, and a verify signal VER_N.

Figure 5:
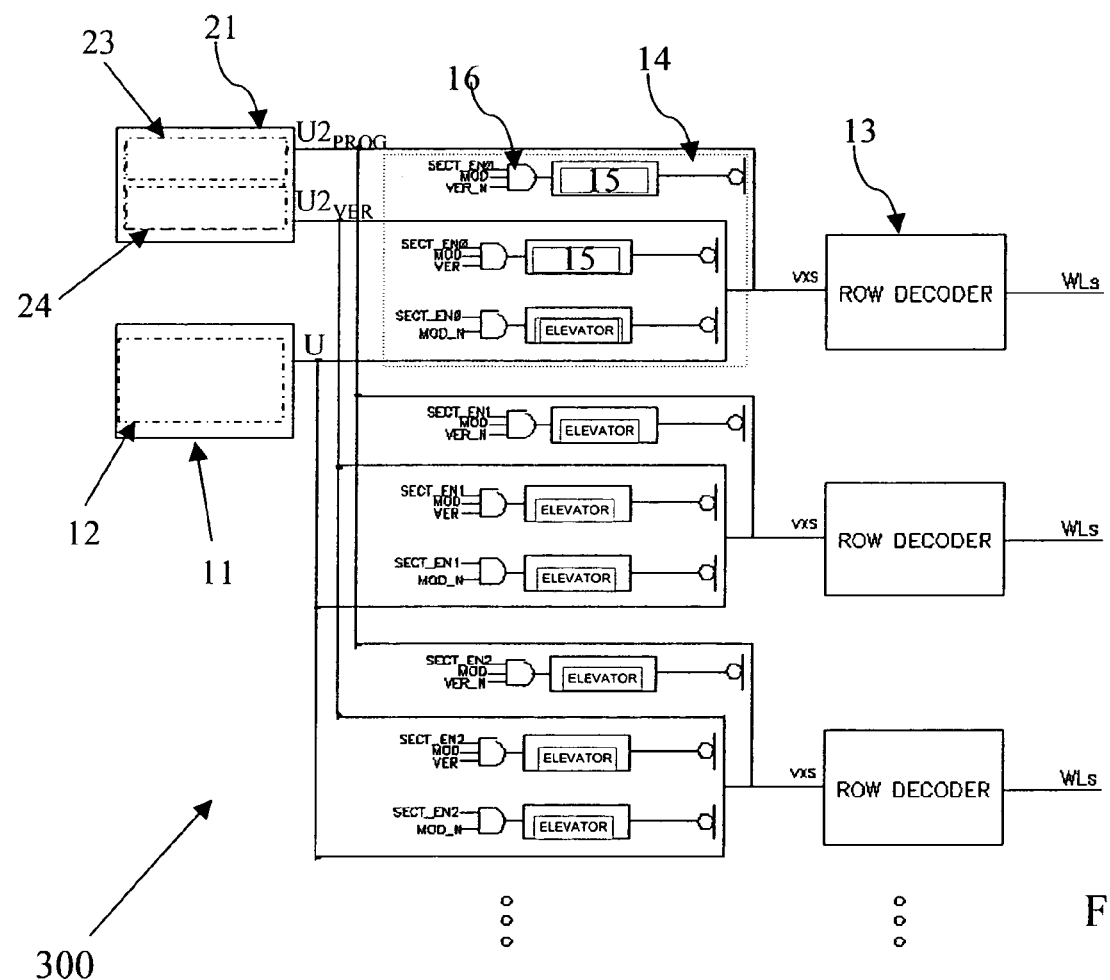
FIG. 5 schematically shows a second embodiment of a multilevel programming circuit according to the invention.

FIG. 5 shows a programming circuit of multilevel memories according to a second embodiment and globally indicated with 300, wherein components and signals shared by FIG. 4 will be indicated with the same reference labels.

In the circuit 300 there is the first supply block 11 having the first charge pump 12. Such charge pump 12 has an output line U intended to supply voltage values for read operations of the memory cells, as already described with reference to the circuit 200 shown in FIG. 4. Advantageously, according to the invention, the second supply block 21 has two separate charge pumps, a third charge pump 23 and a fourth charge pump 24.

Advantageously, according to the present invention, the third charge pump 23 has an output line $U2_{PROG}$, for biasing of word lines WLs for programming operations of memory cells, whereas the fourth charge pump 24 has an output line $U2_{VER}$, for biasing word lines WLs for verify operations of memory cells.

The operation is now described of the circuits 200 and 300 of the two preferred embodiments, according to the invention.

In both the preferred embodiments, the management of the voltage sources $U_{PROG}$ and $U_{VER}$ is different from the one presented in the prior circuits due to the presence of a new verify signal VER at the input of the gate 16.

The use of this signal together with the operative mode signal MOD implies a method for programming the multilevel memories of the circuits 200 and 300 that is different from the prior approaches.

During read operations of a memory cell, the operative mode MOD and verify VER signals will be both at a low logic value; in other words:

MOD=VER=0.

During verify operations of a memory cell, the operative mode signal MOD will be at a low logic value, whereas the verify signal VER will be at a high logic value; in other words, there will be:

MOD=0 and VER=1.

During programming operations of a memory cell, the operative mode signal MOD will be at a high logic value, whereas the verify signal VER will be at a low logic value; in other words, there will be:

MOD=1 and VER=0.

Figure 1:
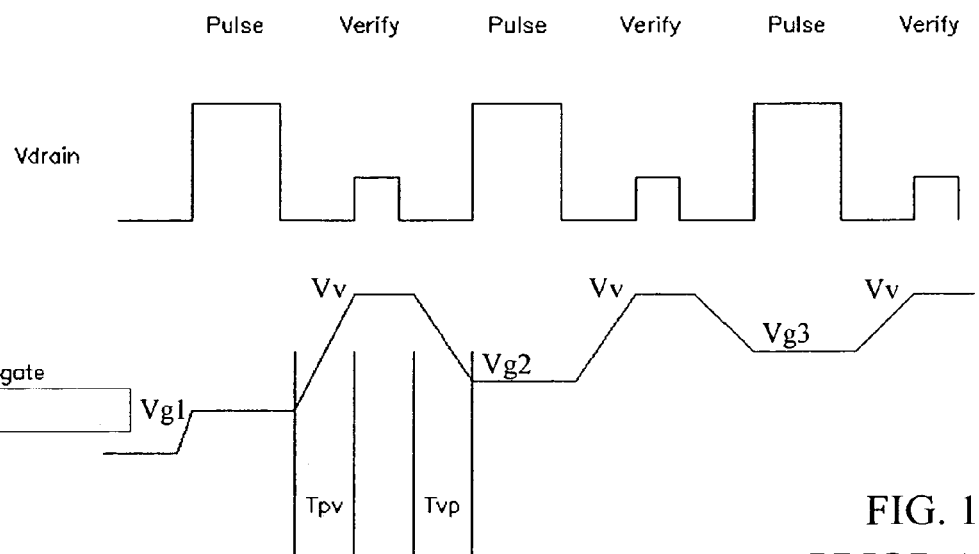
FIG. 1 schematically shows the patterns in time of the gate and drain voltages of a multilevel memory cell, during a multilevel programming performed according to the prior art.
Figure 2:
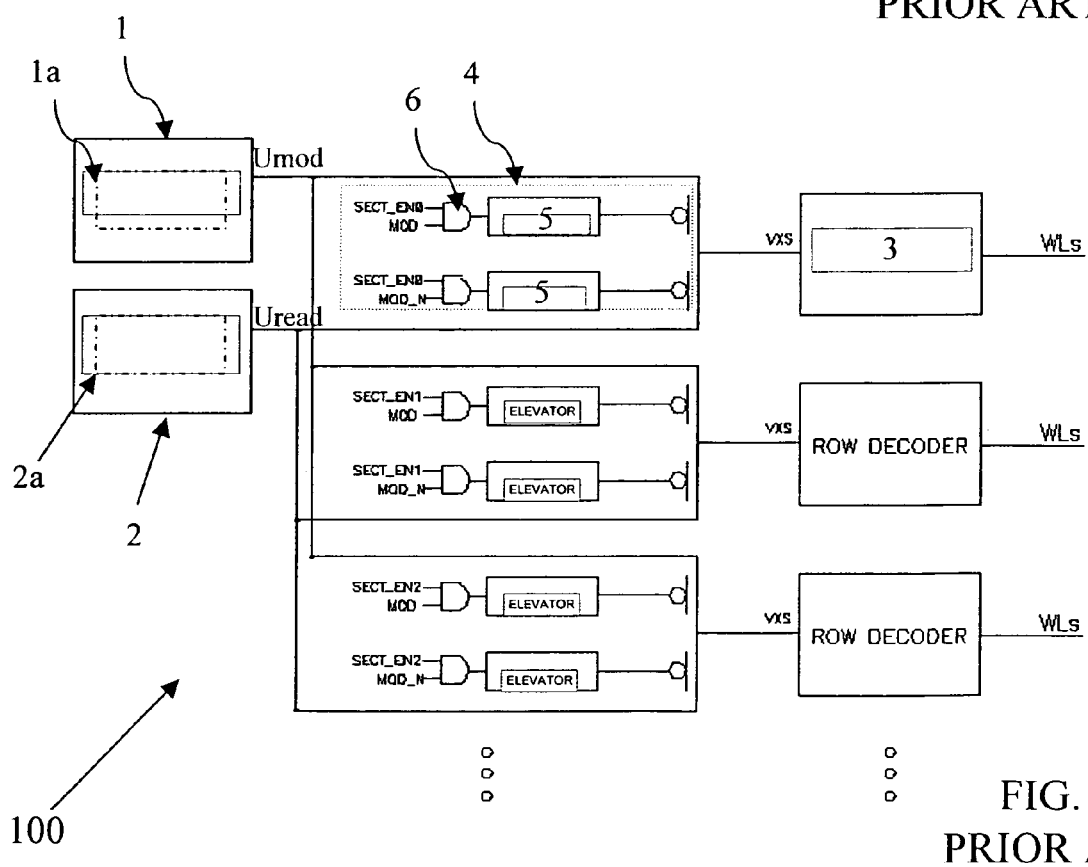
FIG. 2 schematically shows a multilevel programming circuit realized according to the prior art.
Figure 3:
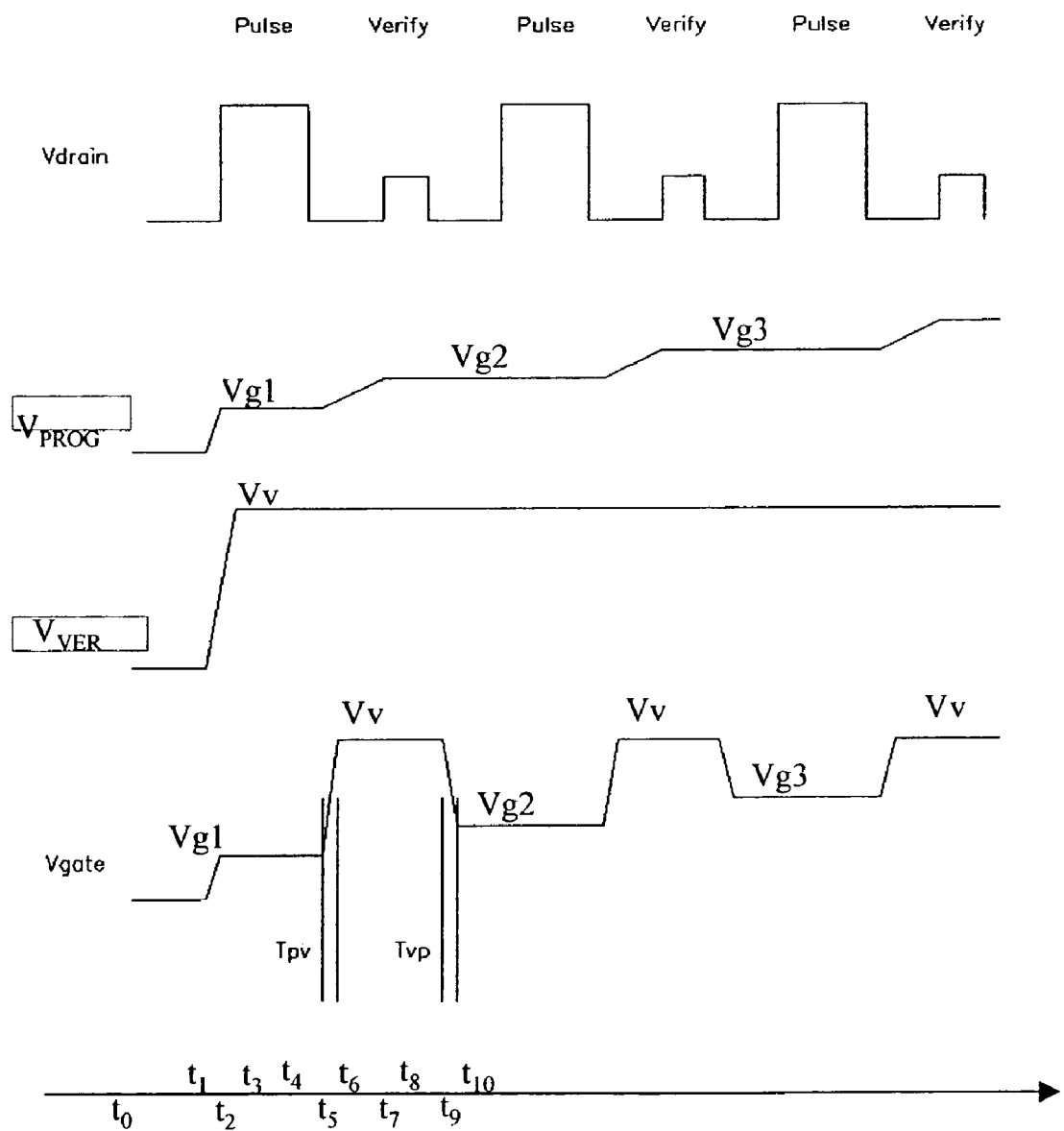
FIG. 3 schematically shows the patterns in time of the drain and gate voltages of a multilevel memory cell during a multilevel programming performed with the method according to the present invention.

FIG. 3 shows the patterns of the programming voltage $V_{PROG}$, verify voltage $V_{VER}$, as well as the drain voltage Vdrain and gate voltages Vgi, Vv of the cell to be programmed or verified, respectively, on the basis of the multilevel programming method, according to the present invention.

More particularly:

At time $t=t_0$: all the signals are at a low logic value.

At time $t=t_1$: simultaneous initialization of the programming and verify signals. The voltage signals $V_{PROG}$ and $V_{VER}$ switch to a high logic value simultaneously, causing the start of a variation of the gate voltage Vgate.

At time $t=t_2$: programming pulse; a programming operation is required. The circuit thus brings the operative mode signal MOD to a high logic value (MOD=1) and it keeps the verify signal VER at a low logic value (VER=0). The gate voltage of the memory cell to be programmed is set at a control value $V_{PROG}$=Vgate=Vg1.

At time $t=t_3$: verify signal is at an operative value. The verify signal $V_{VER}$ reaches its operative value $V_{VER}$=VV, waiting to be used for verify operations.

At time $t=t_4$: programming pulse end.

At time $t=t_5$: simultaneous preparation of programming voltages for successive operations. The value of the gate voltage Vgate starts to increase for reaching the verify voltage value VV. The programming voltage $V_{PROG}$ starts to increase for preparing the successive programming voltage level Vg2.

At time $t=t_6$: gate terminal with verify value. The gate reaches a voltage value Vgate=VV, ready to be used for verify operations. Advantageously, according to the invention, the switching time interval Tvp between a programming voltage value and a verify one, such that t5<=Tpv<=t6, is lower than the prior solutions, being the verify voltage value VV already available at the time t=t3.

At time $t=t_7$: verify pulse; a verify operation is required. The circuit thus brings the verify signal VER to a high logic value (VER=1) and it brings the operative mode signal MOD to a low logic value (MOD=0). Simultaneously a new programming pulse value Vg2 becomes available, for a successive programming operation.

At time $t=t_8$: verify pulse end

At time $t=t_9$: Vgate starts to decrease to reach a successive programming voltage value.

At time $t=t_{10}$: Vgate reaches a programming voltage value Vg2. Advantageously according to the invention, the switching time interval Tvp between a verify voltage value and a programming one, such that t8<=Tvp<=t10, is lower than the solutions of the prior art, being the verify voltage value Vg2 already available at time t=t7.

The control signal VER is activated and deactivated by an algorithm. The control signal MOD in the proposed solution is activated at hardware level further to a program control signal (however it could be also managed by an algorithm).

Advantageously, according to the invention, the voltage signals $V_{PROG}$ and $V_{VER}$ are simultaneously increased, respectively for the programming and the verification of memory cells with a transistor; such cells, in consequence, are biased with Vgate values equal to Vgi and Vv.

Advantageously according to the invention, the simultaneous availability of the two above sources enables preparing the voltage level Vgi+1 of the successive cell programming voltage, once the current pulse has just ended, while the value of the verify voltage VV is constant and always available.

With the proposed method, the switching wait time Tvp between a verify voltage value and a programming one becomes short, being the programming voltage value to be applied to the gate yet ready. Similarly the switching time Tpv between a programming voltage value and a verify one is reduced, since the verify voltage is always available.

The two circuit solutions, according to the two preferred embodiments, moreover, occupy the same area in an integrated circuit with respect to the prior solutions.

In conclusion, the multilevel programming described in the present invention optimizes the management of the gate voltages for programming and verify operations and is more efficient in terms of time with respect to prior circuits, minimizing the times of the transients between programming and verify operations. Moreover, manufacturing an integrated circuit does not require greater area with respect to the prior circuits.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

The invention claimed is:

1. A method for programming a multilevel memory of the flash EEPROM type having a matrix of cells grouped in memory words and associated with a row decoder circuit supplied by a first and by a second supply blocks associated with corresponding charge pumps, comprising: simultaneously generating a first programming voltage value and a second verify voltage value and using the first programming voltage value and the verify voltage value to bias word lines of the memory matrix during respective programming and verify operations of the memory, and wherein the first programming voltage value and the second verify voltage value are applied simultaneously, respectively, on two output lines of a second charge pump of the second supply block.

2. The method of claim 1 wherein the verifying voltage remains at a constant value when it is generated.

3. A method for programming a multilevel memory of the flash EEPROM type having a matrix of cells grouped in memory words and associated with a row decoder circuit supplied by a first and by a second supply blocks associated with corresponding charge pumps, comprising: simultaneously generating a first programming voltage value and a second verify voltage value and using the first programming voltage value and the verify voltage value to bias word lines of the memory matrix during respective programming and verify operations of the memory, wherein the first programming voltage value and second verify voltage value are applied simultaneously, respectively on an output line of a third charge pump and on an output line of a fourth charge pump, the third and fourth charge pumps formed as part of the second supply block.

4. A programming circuit of multilevel memories comprising:
a first supply block to generate voltage values for read operations of memory cells;
a second supply block to generate voltage values for programming and verify operations of memory cells;
a row decoder, to select the word lines of memory cells to be selected;
a switch to select the programming or verify operation to be performed on memory cells; and
the second supply block having a first output line and a second output line, the first output line biasing word lines for programming operations and the second output line biasing word lines for verify operations.

5. The circuit of claim 4 wherein said first and second supply blocks respectively comprise first and second charge pumps.

6. A programming circuit of multilevel memories comprising:
a first supply block to generate voltage values for read operations of memory cells;
a second supply block to generate voltage values for programming and verify operations of the memory cells;
a row decoder to select word lines of memory cells to be programmed;
a switch to select the programming or verify operation to be performed on the memory cells; and
the second supply block comprising a third charge pump and a fourth charge pump, the third charge pump having an output line to bias word lines for programming operations, the fourth charge pump having an output line to bias word lines for verify operations.

7. The circuit of claim 6 wherein the second supply block is configured to simultaneously generate the program voltage value and verify voltage value.

8. The circuit of claim 6 wherein the second supply block is adapted to generate the verify voltage value at a constant voltage level.

9. The circuit of claim 6 wherein the second supply block is adapted to generate the program voltage value at a different voltage level during a time the verify voltage value is selected by the switch.

10. The circuit of claim 6 wherein the memory cells comprise a multilevel memory of flash EEPROM cells organized in rows and columns and grouped in memory words.

11. The circuit of claim 6 wherein the memory cells comprise two-bit NROM flash memory cells.

12. A method, comprising:
simultaneously generating a first programming voltage and a verifying voltage via a program voltage generator and a verify voltage generator, respectively;
enabling a first switch to supply the first programming voltage to a word line coupled to a matrix of memory cells;
enabling a second switch to supply the verifying voltage to the word line; and
disabling the first switch to not supply the first programming voltage at the time of or before enabling the second switch and disabling the second switch at the time of or before enabling a further step of enabling the first switch again.

13. The method of claim 12 wherein the verifying voltage remains at a constant value when it is generated.

14. The method of claim 12 further comprising generating a second programming voltage prior to enabling the first switch again to supply the second programming voltage to the word line.

15. The method of claim 12 further comprising supplying the first programming voltage and the verifying voltage to a row decoder prior to supplying the first programming voltage and the verifying voltage to the word line.

16. A method, comprising:
   simultaneously generating a programming voltage and a verifying voltage; and
   selectively applying one of the programming voltage and the verifying voltage at a time to a word line, wherein simultaneously generating a programming voltage and a verifying voltage comprises varying a voltage level of the programming voltage when the verifying voltage is applied to the word line.

17. The method of claim 16 wherein simultaneously generating the programming voltage and the verifying voltage comprises simultaneously generating the programming voltage at a first voltage generator and generating the verifying voltage at a second voltage generator and applying the programming voltage and the verifying voltage of the first and second voltage generators, respectively, to a selection circuit.

18. The method of claim 17, further comprising programming the selection circuit to selectively apply the programming voltage and the verifying voltage to a word line at discrete periods in time.

* * * * *